(12) United States Patent
Gradzki

(10) Patent No.: US 6,342,816 B1
(45) Date of Patent: Jan. 29, 2002

(54) VOLTAGE LIMITING BIAS CIRCUIT FOR REDUCTION OF HOT ELECTRON DEGRADATION EFFECTS IN MOS CASCODE CIRCUITS

(75) Inventor: Pawel M. Gradzki, Potomoc, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/545,321

(22) Filed: Apr. 6, 2000

(51) Int. Cl.$^7$ ................................................ H03F 1/22
(52) U.S. Cl. ...................................................... 330/311
(58) Field of Search ................................ 330/277, 288, 330/307, 311, 296

(56) References Cited

U.S. PATENT DOCUMENTS

| | | | | |
|---|---|---|---|---|
| 5,504,444 A | * | 4/1996 | Neugebauer | ............ 330/288 X |
| 6,177,838 B1 | * | 1/2001 | Chiu | ...................... 330/311 X |

* cited by examiner

Primary Examiner—Steven J. Mottola
(74) Attorney, Agent, or Firm—George M. Steres; John Schipper

(57) ABSTRACT

MOS Cascode amplifier circuits are subject to long-term or instantaneous changes (degradation) of performance characteristics by excess substrate currents. These currents can be generated in the grounded source transistor of the cascode connected output transistors during peak excursions of drain-source voltage across the grounded source transistor when the output voltage of the MOS Cascode amplifier circuit is at a maximum. An improved MOS Cascode amplifier circuit arrangement includes a voltage limiting bias circuit arrangement of additional transistors. The bias circuit arrangement acts as a series voltage-limiting device between the MOS Cascode amplifier circuit output node and the drain node of the upper-most cascode connected transistors when the MOS Cascode amplifier circuit output voltage is at its maximum value. An embodiment of the improved MOS Cascode amplifier circuit arrangement is arranged to limit the drain-source voltage excursion peak on the sensitive cascode transistor to a value below a preselected critical voltage, Vcrit. Vcrit is defined as the drain-source voltage value for the sensitive cascode transistor for which the instantaneous and/or cumulative substrate current caused by peak drain-source voltage excursions greater than Vcrit would instantaneously or cumulatively degrade the transistor's sensitive electrical parameters to an extent that would degrade (an) amplifier performance characteristic(s) to an appreciable degree. The additional transistors of one embodiment of the bias circuit arrangement are connected by internal adjacent source-drain nodes as a sequential chain with gates biased at respective fixed voltages. One external drain node of the chain connects to the output node of the MOS cascode amplifier and one external source node of the chain connects to drain of the uppermost cascode connected transistors. The number of additional transistors and the fixed bias gate voltages are selected to limit the peak drain-source voltage excursion on the sensitive transistor under selected operating conditions.

14 Claims, 7 Drawing Sheets

VOLTAGE LIMITING BIAS CIRCUIT FOR REDUCTION OF HOT ELECTRON DEGRADATION EFFECTS IN MOS CASCODE CIRCUITS

FIELD OF THE INVENTION

This invention relates generally to stabilizing the operational performance of MOS circuits and specifically to minimizing limitations on cascode amplifier circuit performance and reliability caused by excessive substrate current induced by hot electrons from high drain-to-source voltages.

BACKGROUND

In MOS amplifier and current mirror circuits, transistors biased into the saturation to region can experience an undesirable substrate current arising from impact ionization (due to the so-called "hot electron" effect). Impact ionization in the MOSFET channel is described in the literature and is generally known by circuit design practitioners.

A physical model of this effect is depicted in a single p-well n-channel transistor 300 of FIG. 3. Transistor 300 is shown biased in saturation, that is, with the inversion layer 302 under the gate oxide 304 terminating short of the edge of the actual drain diffusion 306 at a pinch-off point 308. This pinch-off point 308 occurs at a drain-to-source voltage (Vds) of Vdssat. The drain current ID increases relatively little as drain-to-source voltage Vds increases beyond Vdssat. The location of the pinch-off point 308 is shown as offset from actual edge of the diffusion 306, which is the case when Vds is greater than Vdssat.

At constant gate-to-source voltage Vgs, the pinch-off point 308 moves relatively little as Vds increases. Consequently, the drain current ID changes relatively little as well. This is shown in the V-I characteristics of FIG. 5, where the ID vs. Vds operating characteristic shows the transistor operating in one of two regions, the triode region with low drain-source impedance, and the saturation region with high drain-source impedance.

Beyond Vdssat, the transistor region between the inversion layer end 308 and the edge of the drain 306 sustains nearly all of the increased voltage potential between drain and source. At sufficiently high Vds, the electric field in the depletion region between inversion layer 302 and the edge of drain 306 can cause electrons flowing from the end of the inversion layer 308 to the drain 306 (i.e., in the depletion region) to gain additional energy. With sufficient additional energy, the free carriers in the depletion region cause impact ionization, and generate additional free carriers (electron-hole pairs 320).

These additional free carriers 320 are swept out of the depletion region by the high electric field. Some of the resulting free holes flow into the P-type substrate region as majority carriers, creating a substrate current Isub that increases with Vds, as illustrated in FIG. 4. Some of the free electrons are swept into the N-type drain region as majority carriers and add to the drain current Ids. These two charge carrier flows appear as an additional component Isub of the total current in the drain and substrate terminals.

An empirical expression for the impact ionization substrate current Isub is given by, $$Isub = K1 \ (Vds\ B\ Vdssat) * Id * (\exp\ [-K2/(Vds-Vdssat)]),$$

Where K1 and K2 are process-dependent parameters and Vdssat is the value of Vds where the drain characteristics enter the saturation region. Under normal operating conditions, MOS devices have essentially zero substrate current Oust the leakage current of the reverse biased drain-to-substrate depletion region), as illustrated in FIG. 4. The effect is generally much less significant in PMOS devices because the lower mobility holes in the depletion region are less efficient in creating hole-electron pairs than are the higher mobility electrons.

Differentiating this expression with respect to drain voltage, the small signal shunt conductance ($g_{db}$) from drain to substrate is given as, $$g_{db} = K2\ [I_{SUB}]/(Vds-Vd_{sat})\hat{},\ 2.$$

Substituting for $I_{SUB}$ with the previous expression and rearranging factors produces:

$$g_{db} = K2K1(Vds-Vdssat)^{-1}(\exp[-[K2/(Vds-Vdssat)]].$$

FIG. 2 illustrates a plot of $g_{db}$ and its inverse, $r_{db}$, for a typical NMOS transistor. $r_{db}$ is the equivalent substrate current drain-to-body output resistor that would combine in parallel with the normal transistor output resistance $r_0$. $r_{db}$ is calculated for a typical NMOS transistor with K1=5 V^-1 and K2=30 V and plotted vs. normalized drain-source voltage, Vds-Vdssat. Also plotted is the equivalent output conductance, $g_{db}$, which is the inverse of $r_{db}$. The extreme nonlinear behavior of Isub causes the parallel combination of $r_{db}$ and $r_0$ to be essentially $r_0$ at drain voltages around Vdssat and below, since $r_{db}$ is many orders of magnitude greater than typical $r_0$.

However, at instantaneous drain-to-source voltages not much higher than a few times Vdssat, the output impedance of the transistor can be completely dominated by $r_{db}$. This is one example of how instantaneous or cumulative changes in hot-electron induced substrate current can influence the magnitude and/or variability of device characteristics. This influence can limit and sometimes defeat the possibility of achieving or maintaining desired performance circuit functionality.

As the instantaneous drain-to-source voltage of the transistor varies during operation, the instantaneous amount of the substrate current also varies causing variation of the small signal output conductance. Depending on the operating point and the output voltage swing of the cascode circuit (between the maximum required output voltage and the minimum possible output voltage), the substrate current Isub can vary dramatically. Isub can vary from a value essentially equal to zero at low and moderate Vds to a value that represents a significant portion of the total drain current as the instantaneous Vds approaches the maximum required output voltage or exceeds a critical value. The critical value of Vds (Vds=Vcrit) for the onset of significant Isub (i.e., Vds=Vcrit) depends on the available power supply voltage, the particular circuit function and performance factor(s) at issue, the transistor technology, the transistor dimensions (primarily channel length), and the bias and signal levels. Highly nonlinear circuit behavior may occur depending on the level of the output voltage. If the substrate current magnitude or the magnitude of current variation is substantial compared to the expected drain current or normal drain current variation, it may adversely effect circuit functional performance, behavior and reliability.

This critical value Vcrit depends on the details of the transistor construction, the magnitude of the instantaneous differences between drain, gate, source and substrate voltages and the drain current. The magnitude of the substrate current is a highly nonlinear function of the voltage differences and current, and can vary by orders of magnitude over very small changes in the instantaneous terminal voltages. The substrate current is affected most by the drain-to-source voltage Vds once Vds approaches Vcrit for the particular transistor technology, geometry and circuit voltage conditions.

The performance of a circuit may be affected by this radically nonlinear Isub behavior primarily in two ways. First, radical variation of $I_{SUB}$ may limit one or more selected characteristics of circuit performance (bias current, switching voltage threshold, switching time delay, gain, distortion, noise, and the like). A momentary increase in $I_{SUB}$ at a high Vds voltage above critical value Vcrit causes an unacceptable momentary change in an electrical device parameter from its nominal design value. Second, cumulative changes or drifts in a device electrical parameter e.g., parameters such as threshold voltage, transconductance, leakage current and the like may affect circuit performance. Sufficient shifts in device parameters may cause a consequent reduction of the Mean-Time-to-Failure (MTBF) for circuits of a given type, i.e. decreased reliability.

A circuit having a device with one or more electrical parameters that change rapidly with small changes of signal voltage, or output voltage level, essentially independent of the gate-source control voltage may also exhibit unacceptable changes in circuit performance, e.g., non-linear gain, distortion, impedance mismatch, and the like.

The long-term effects of excess substrate current are exhibited by slow degradation of the device electrical parameters (Vth, Gm, sub-threshold leakage, etc.). The hot carriers that cause Isub are known to cause charge trapping in the gate oxide, which, over time, causes threshold, transconductance and sub-threshold behavior shifts. Eventually, the degradation of the device parameters due to excess substrate current will reach a level where the cascode circuit performance will no longer meet the required specification and the cascode circuit will fail.

Deterioration of transistor characteristics by substrate current is known to cause undesirable changes in performance of circuits over time. The literature describes transistor modeling and circuit simulation techniques for calculating the influence of Isub on circuit behavior. Known Isub vs. Vds models (e.g., the modified Mar's model and Sakurai's model described elsewhere) and simulators (the known RELY simulator described elsewhere) are combined with a segmented or iterative simulation scheme.

Referring to FIG. 1 a prior art attempt to reduce degradation of performance characteristics of a simple amplifier output circuit due to substrate current and thus to improve the circuit behavior is shown. An amplifier circuit stage consisting of a simple grounded source single transistor output stage is replaced by a circuit arrangement 100 of a two transistor series combination: transistor M6A, and M6. This series combination is generally referred to as a cascode connection with M6A being the upper cascode transistor M6a and transistor M6 being the grounded source lower transistor. Upper cascode transistor M6A is interposed between the drain of the grounded source transistor and the amplifier output with its output drain node connected to amplifier output Vout and its source node connected to the drain of the grounded source transistor M6

M6 is driven by input Vin and M6A has its gate connected to a reference voltage Vref. The arrangement of transistor M6in series between output amplifier node Vout and the M6 drain node partially ameliorates degradation of the circuit gain Gc=ΔVout/ΔVin, (a selected circuit functional characteristic} and defers catastrophic failure of this functional characteristic for this particular analog circuit under a particular voltage stress. Including the Vref biased common-gate buffering transistor M6A between the drain 102 of the grounded-source output transistor M6 and the voltage output terminal Vout converts the output stage 100 into a cascode output and reduces the maximum Vds voltage stress on transistor M6 during peak output voltage excursions.

The peak substrate current Isub1 in transistor M6 before the substitution is made is about 10 ma during the peak voltage excursion (4 volts) at the output, Vout. After the substitution of the grounded-gate cascode transistor, M6A, the gate 104 of M6A is biased by Vref, a fixed voltage reference. Vref is chosen to set the gate of M6A so that the maximum Vds across transistor M6 is limited (and thus limiting the peak Isub in transistor M6) during the peak excursion of Vout.

Transistor M6A is biased so that, as the drain-source voltage Vds for transistor M6 approaches Vref minus the threshold voltage Vt of M6A, transistor M6A begins to turn off (move from the triode region to the saturation region) and absorb additional voltage supplied by source current Ido from the power supply Vdd. Vds thus will be limited to a maximum value of about Vref minus Vt. Vref and M6A limits Vds across transistor M6 to Vdsmax such that with Vdd of 10 volts and Vout at the desired 4 volts, the peak value of transistor M6 substrate current (Isub1) is reduced to essentially zero. The cascode connection causes the 4-volt peak to be shared by transistor M6 and M6A.

With Isub1 reduced to essentially zero, the gain, Gc, of the circuit is therefore stabilized so that after 115 days of simulated operation, instead of 40% degradation, there is essentially a negligible shift in gain. This provides some reduction in performance degradation sought by the inclusion of the grounded-gate transistor M6A biased to limit the peak Vds across transistor M6.

However, the cascode transistor M6A now takes up part of the voltage stress previously fully absorbed by transistor M6. Although Isub for M6A is lower than the previous value for transistor M6 (4 ma vs. 10 ma), it is still considerable. Since the operating point of M6A is biased closer to or into the triode region for low values of Vds, its impedance is lower than transistor M6 and consequently it has much less effect on the gain of the circuit 100. However, with the still relatively high value of Isub in M6A, the prospect of a stable circuit gain over a long life is not assured.

Regulated cascode circuits described in the literature can produce even higher gain than ordinary cascode circuits. See U.S. Pat. 5,039,954 by Bult et al., and U.S. Pat. No. 5,748,040 by Leung, incorporated herein by reference. Their utilization is somewhat restricted to small voltage swings and low to moderate output voltage levels because this high gain is achieved only at low drain-to-source voltage. Because their higher gain is achieved by high output impedance they are even more susceptible to hot electron induced substrate current. At higher output voltage, i.e., high Vds, the gain is reduced to levels similar to ordinary cascode circuits.

Additionally, the local feedback used in previous regulated cascode circuits generally monitor source current to maintain circuit function. However, the excess substrate current from hot-electron effects does not flow in the source loop, so is not subject to the benefits of the regulated cascode local feedback.

These and many other examples of substrate current (hot electron effects) causing limited and/or degraded circuit performance for critical circuit functional characteristics and consequent decreased reliability are known in the integrated circuit arts. Performance and reliability limitations imposed on using known circuits to provide useful circuit functions are increasing as the trend for lower device operating voltages continues over time. The ever-increasing demand for faster circuit performance impels the continuing decrease in active electrical circuit dimensions and consequent increased sensitivity to degradation by substrate current.

There is a large and pressing need to provide improvements in circuits to obviate these limitations on circuit designers and manufacturers.

SUMMARY

MOS Cascode amplifier circuits are subject to long-term or instantaneous changes (degradation) of performance characteristics by excess substrate currents. These currents can be generated in the grounded source transistor of the cascode connected output transistors during peak excursions of drain-source voltage across the grounded source transistor when the output voltage of the MOS Cascode amplifier circuit is at a maximum. The improved Cascode amplifier circuit arrangement of the present invention includes a voltage limiting bias circuit arrangement of additional transistors. The bias circuit arrangement acts as a series voltage-limiting device between the MOS Cascode amplifier circuit output node and the drain node of the upper-most cascode connected transistors when the MOS Cascode amplifier circuit output voltage is at its maximum value. An embodiment of the improved MOS Cascode amplifier circuit arrangement is arranged to limit the drain-source voltage excursion peak on the sensitive cascode transistor to a value below a pre-selected critical voltage, Vcrit. Vcrit is defined as the drain-source voltage value for the sensitive cascode transistor for which the instantaneous and/or cumulative substrate current caused by peak drain-source voltage excursions greater than Vcrit would instantaneously or cumulatively degrade the transistor's sensitive electrical parameters to an extent that would degrade (an) amplifier performance characteristic(s) to an appreciable degree.

The additional transistors of one embodiment of the bias circuit arrangement are connected by internal adjacent source-drain nodes as a sequential chain with gates biased at respective fixed voltages. One external drain node of the chain connects to the output node of the MOS cascode amplifier and one external source node of the chain connects to drain of the uppermost cascode connected transistors. The number of additional transistors and the fixed bias gate voltages are selected to limit the peak drain-source voltage excursion on the sensitive transistor under selected operating conditions.

Embodiments of the voltage-limiting, substrate current minimizing, bias circuit arrangement of the present circuit invention can significantly extend circuit performance, operational lifetime or significantly reduce unwanted circuit performance limitations or decreased reliability resulting from momentary or cumulative electrical parameter variation effects caused by excessive substrate current in individual transistors of over stressed amplifying stages.

The prior art approach of the fixed-gate-biased transistor (effectively grounded gate for small-signal equivalence) interposed between the grounded-source drain and the output terminal disclosed by Hsu, et al., does reduce the substrate current in the transistor M6 enough to extend the lifetime of the circuit described somewhat. However, transistor M6A itself now may experience a considerable amount of substrate current at peak voltages that eventually may degrade its threshold voltage or shunt conductance sufficiently to unacceptably alter the circuit performance.

Embodiments of the present Cascode circuit bias circuit arrangement invention incorporate a first transistor chain, having at least one additional transistor, connected in series between a Cascode circuit output voltage terminal and the drain of a first transistor in a second cascode transistor series chain where the second cascode transistor chain is connected at its source end to circuit ground). The additional transistor (s) in the first chain is (are) biased by fixed voltages at respective gate terminal(s) to limit respective maximum drain-to-source voltages across two or more individual transistors in the second cascode transistor chain. The maximum drain-to-source voltages are limited to respective maximum values below respective critical voltage levels (Vcrit) at which respective substrate currents in the corresponding two or more individual transistors unacceptably change a circuit performance characteristic, (e.g. gain, output impedance, operational lifetime and the like). Additionally, embodiments of the present invention improve reliability, by postponing the circuit's end-of-life, i.e., lengthening the time over which selected circuit characteristics meet predetermined levels.

DETAILED DESCRIPTION OF EMBODIMENTS OF THE PRESENT INVENTION

Two basic assumptions are central to determining stability of circuit performance (e.g. a requirement set {R}) from variations caused by excess substrate currents. The first factor is the determination or specification of which circuit functional characteristic (gain, output resistance and the like) is to be stabilized. The second factor is the determination of how much variation or degradation of selected circuit performance characteristic(s) is allowable over what MTBF. Means for relating these factors to embodiments of the present invention is outlined below.

Circuit analysis techniques, simulation methods and physical electronics characteristic effects are known in the art and are shown in the references cited herein and in other references commonly known by one skilled in the electronic arts. Use of these techniques, methods, and knowledge is within the capability of a person having ordinary skill in the pertinent technical arts of physical electronics and electrical circuit theory and practice.

Figure 6:
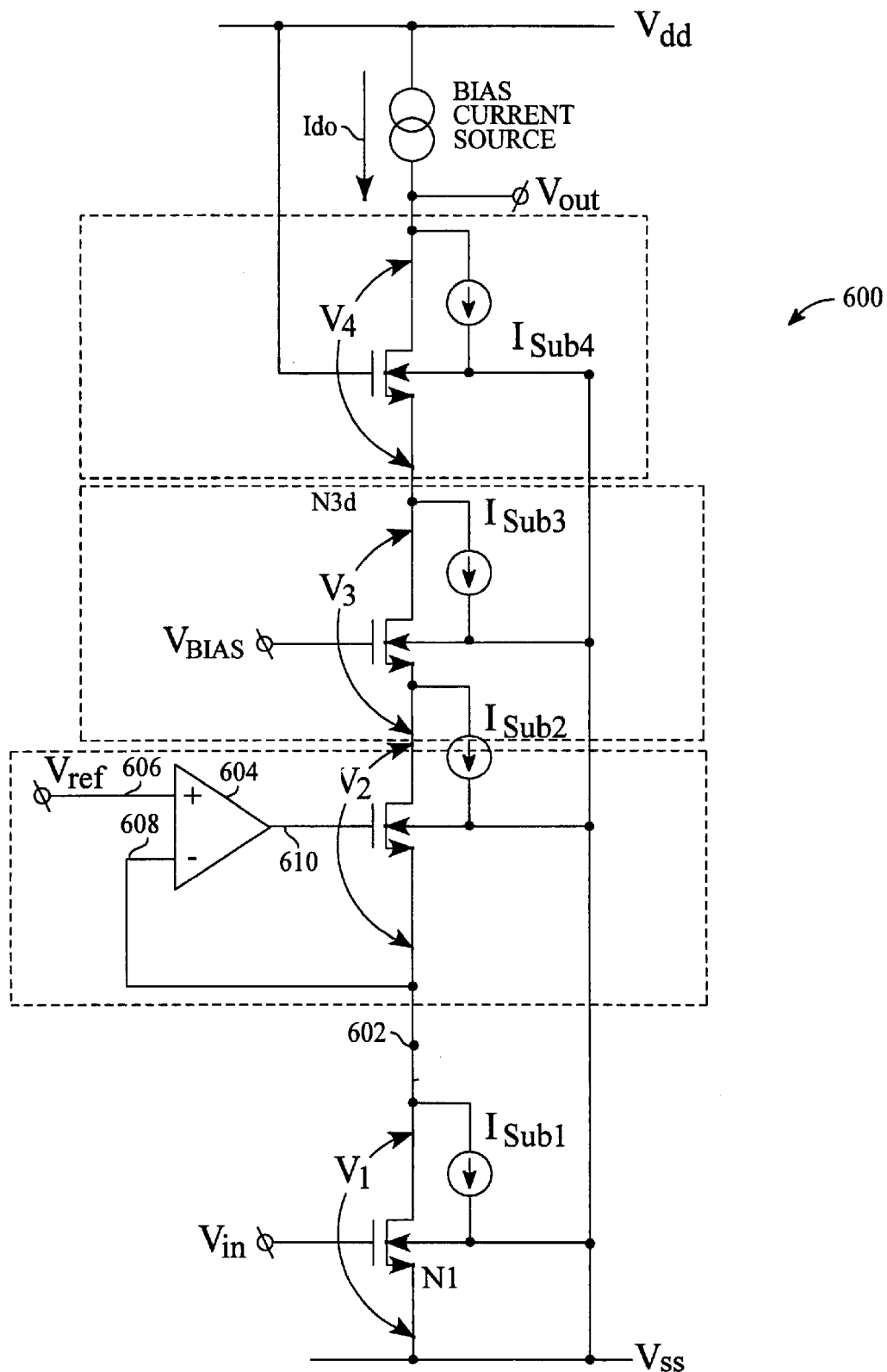
FIG. 6 illustrates one embodiment of a transistor drain-source voltage-limiting bias circuit arrangement for a cascode output circuit according to the present invention.

With regard to FIG. 6 one embodiment of the present performance stabilizing invention is depicted as an n-well CMOS cascode output amplifier stage 600. Transistors N1 and N2 are connected as a cascode pair, with N1 source connected to a common circuit ground terminal Vss. An input source signal Vin drives N1's gate, and transistors N2 and N1 are joined by respective source and drain terminals at a common drain-source connection 602. Vin has upper and lower limits Vin-u, Vin-I established by a selected requirement set {R} of particular operating requirements for the circuit 600.

Additional transistors N4 and transistor N3 are connected in serial source-drain sequence with N4's source coupled to N3's drain. N3's source is similarly coupled to N2's drain N2d. N4 has its drain coupled to output terminal Vout. Output terminal Vout receives a source of current Ido provided from power-supply terminal Vdd. N3's gate receives a fixed bias voltage Vbias from a fixed bias supply terminal. N4's gate is also biased at a fixed voltage by being coupled to power-supply terminal Vdd.

The embodiment 600 of the present invention includes an amplifier, e.g., differential amplifier 604 having a positive sense (non-inverting) input 606 and negative sense (inverting) input 608. An output terminal 610 provides a positive going output voltage responsive to the potential difference between non-inverting terminal 606 and inverting terminal 608. The output terminal 610 is connected to N2's gate. Non-inverting input 606 receives a fixed voltage reference Vref. Inverting input 608 connects to the common drain-source connection 602 of N2 and N1.

Amplifier 604 is selected with suitable additional amplifier characteristics (e.g. input impedance, output impedance, gain, bandwidth and the like) appropriate to cooperate with the cascode transistors N1, N2 and the additional transistors N3, N4 to meet the requirement set {R}. Amplifier 604 and transistors N1, N2, N3, and N4 thus co-operate with the bias voltages Vref and Vbias to stabilize the performance requirement set {R} against unacceptable variation in performance caused by substrate currents.

Vref is selected so that Amplifier 604 biases the transistor M6A to maintain transistor M6 in its saturation region under selected operating conditions of the circuit 600 as outlined below.

A particular set of operating requirements {R} established for the circuit 600 generally includes a requirement that the power-supply Vdd can assume voltage values up to a maximum value Vddmax. The set of operating requirements, {R}, may also include other functional and/or operational circuit requirements R1, R2, - - - R(m), e.g., a minimum gain requirement Gcmin>R1, a maximum output voltage value, Vout max <R2, a maximum input signal voltage level |Vin|<R3, an operating mean-time-to-failure MTBF>R4, a minimum output voltage swing Vout>R5, among others.

For embodiments of the performance stabilizing bias circuit of the present invention, requirement set {R} also includes the constraint that the respective drain-to-source voltages V1, V2 across cascode transistors N1 and N2 will not exceed respective maximum safe values V1 max and V2max.

Alternatively, additional constraints may be placed on additional transistors N3, and N4 that the respective drain-to-source voltages V3, V4 across additional transistors N3 and N4 will not exceed respective maximum safe values V3max and V4max.

Figure 1:
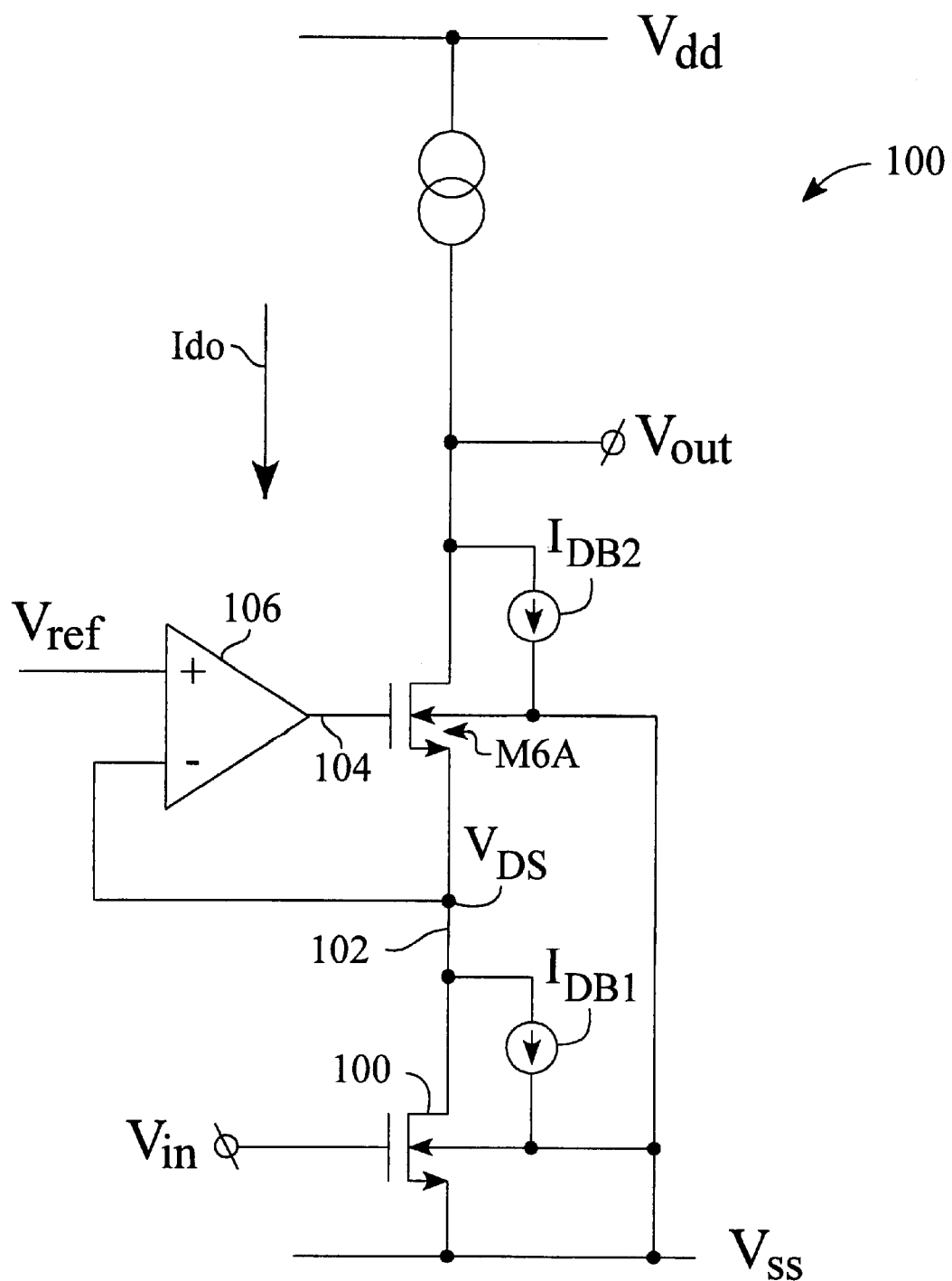
FIG. 1 illustrates a prior art cascode output circuit.
Figure 2:
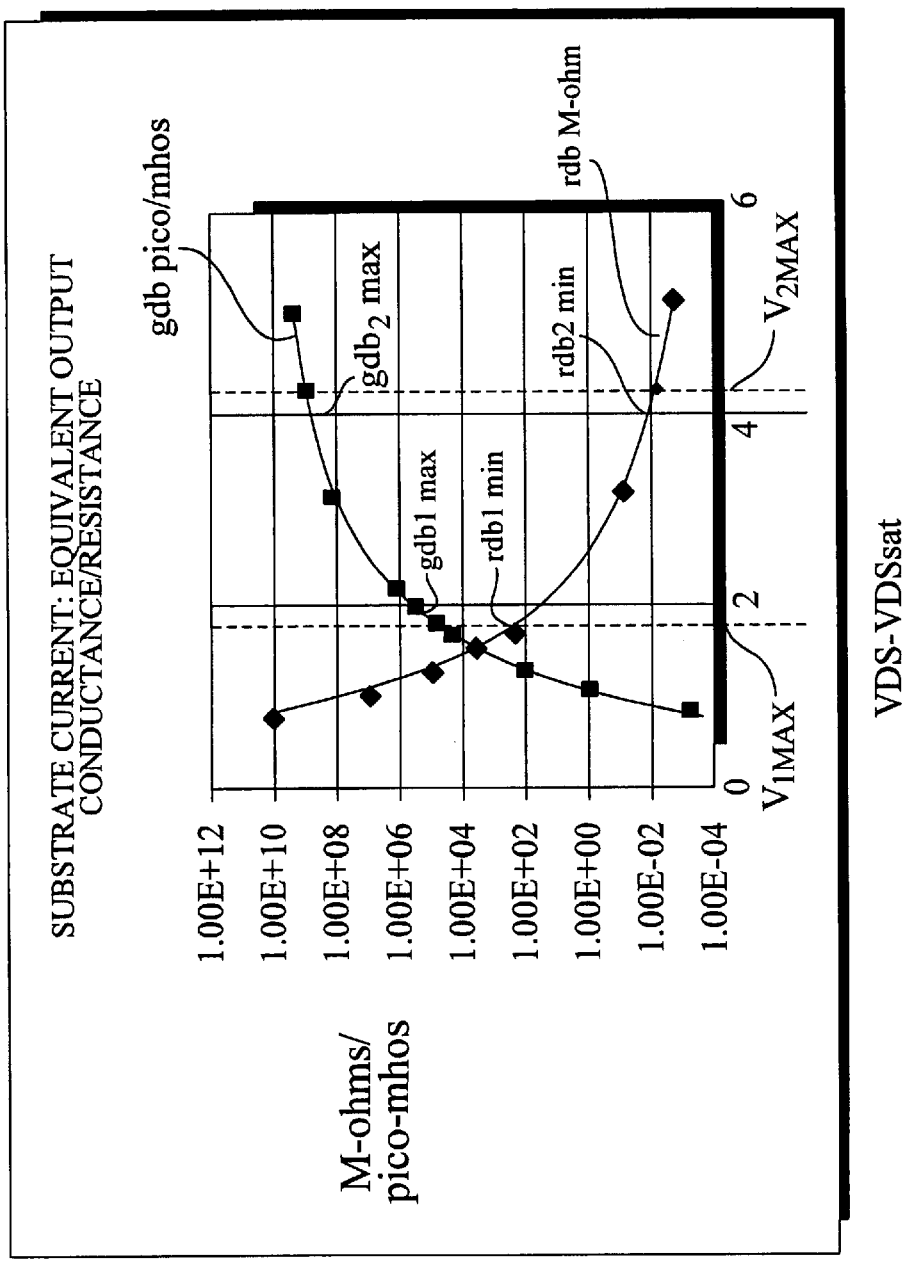
FIG. 2 exhibits a graph of typical small-signal equivalent output resistance variation due to substrate current.
Figure 3:
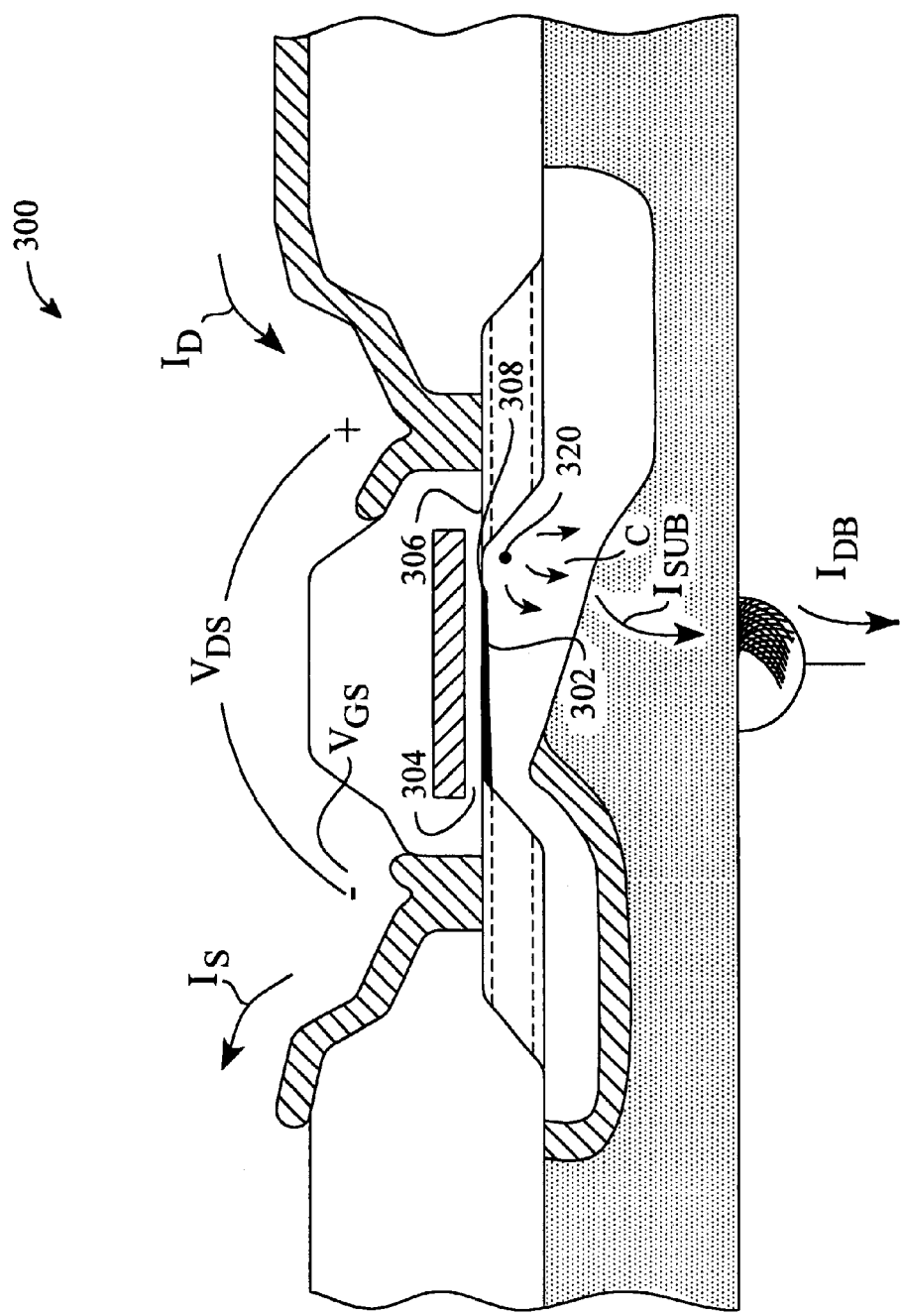
FIG. 3 depicts a cross-sectional view of an NMOS transistor illustrating the origin and terminal path for substrate current.
Figure 4:
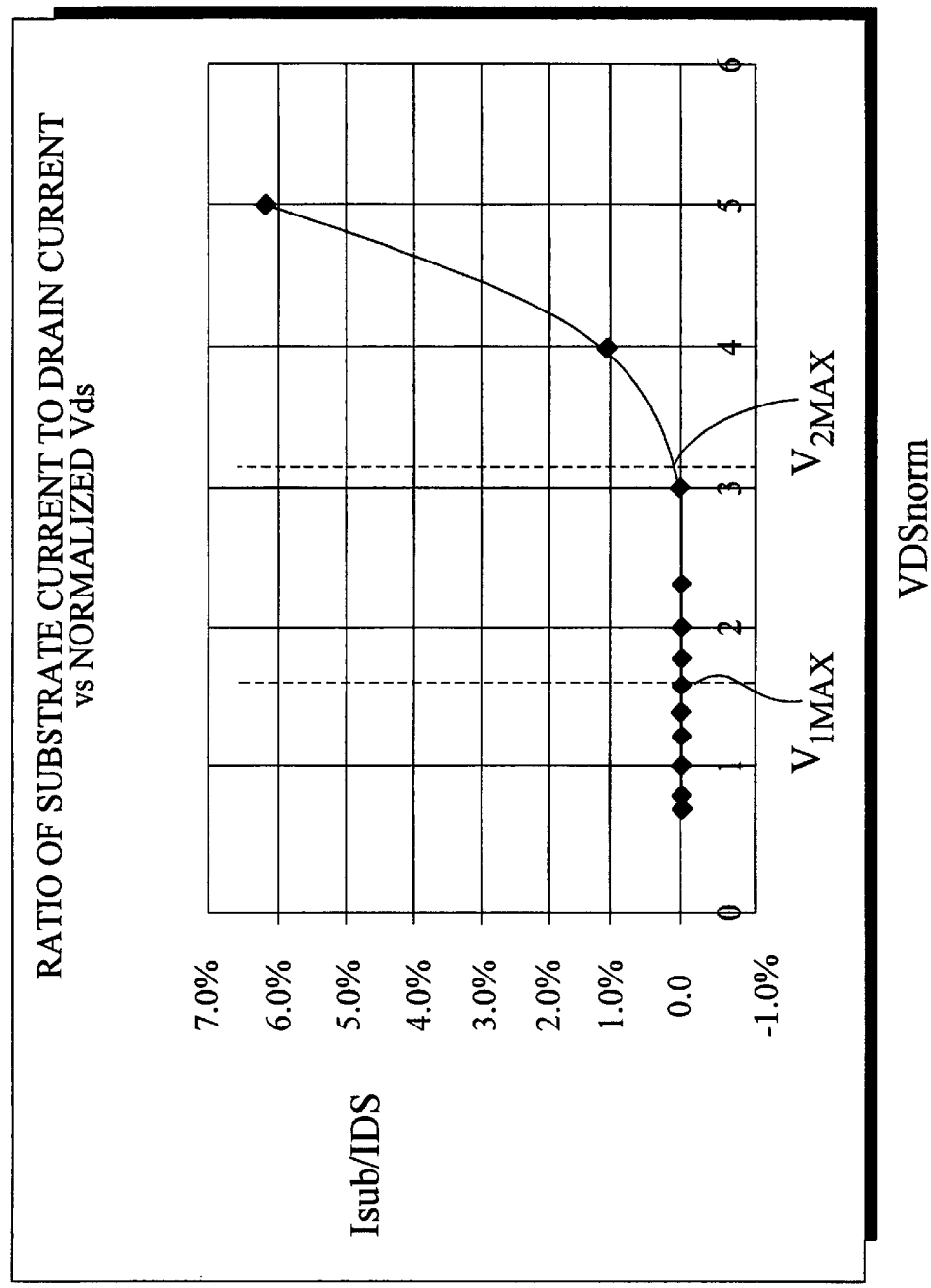
FIG. 4 exemplifies typical normalized substrate current Vs normalized drain-to-source voltage showing the rapid increase at a critical Vds level.
Figure 5:
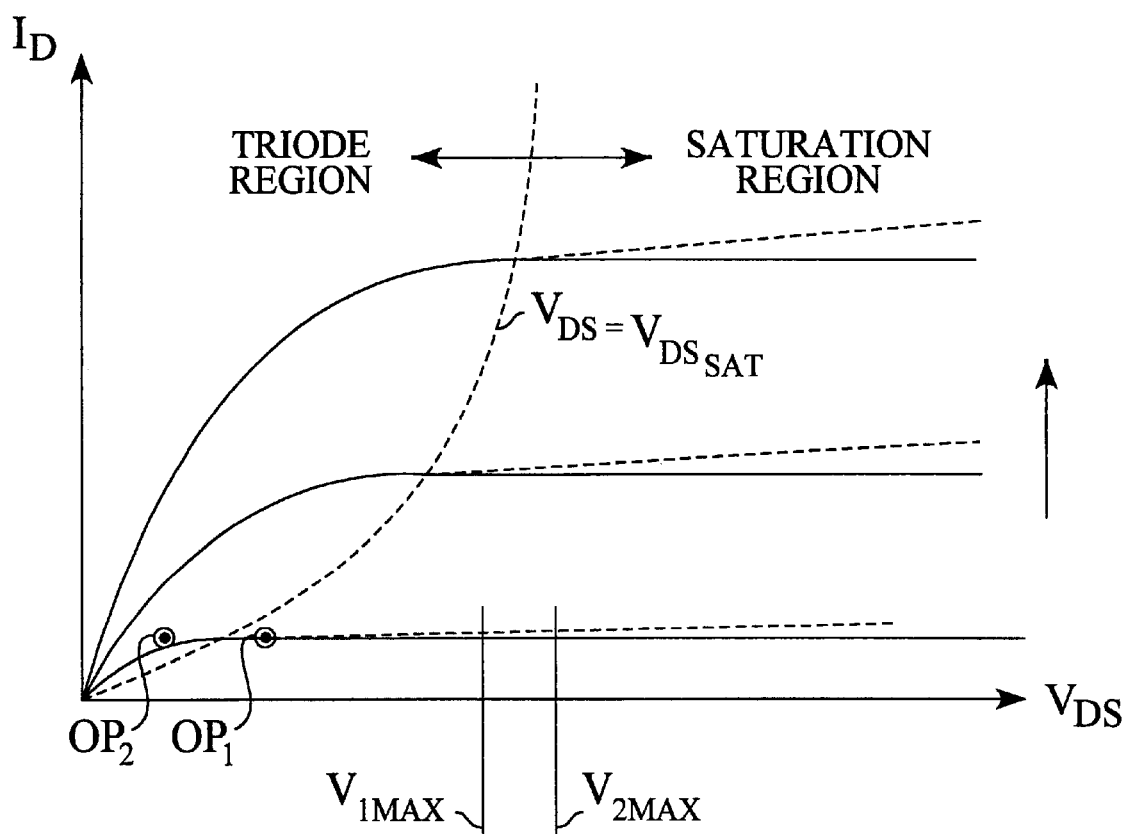
FIG. 5 shows a typical N-channel MOS device characteristic and corresponding operating regions.

To summarize, Vbias and Vref are selected so those transistors N1–N4 and amplifier 604 co-operate to meet the following constraint conditions:

1. If the output voltage Vout is low (i.e., near Vss), N2, N3 and N4 are biased in their respective triode regions (i.e. operating point OP2 of FIG. 5), so they do not significantly contribute to circuit gain (ΔVout/ΔVin).

2. Also, when output voltage Vout is low (e.g., at some Vout-min, near Vss), transistor N1 is biased so that it is in its saturation region (i.e. operating point OP1 of FIG. 5) so that its output impedance is high and the circuit 600 meets the gain requirement of the set {R}.

3. In addition, Vref and Vbias are also selected so that when the output voltage Vout is high (i.e., near Vdd), respective drain-to-source voltages V1, V2 across the respective drain-to-source terminals of transistors N1, N2, (and V3, V4 across N3, N4, if so constrained) do not exceed respective maximum safe levels V1-max, V2-max (and V3-max, V4-max) under the requirement set {R}.

4. The respective safe levels (extrema) V1-max, V2-max, V3-max, V4-max are selected to keep substrate currents Isub1, Isub2, Isub3, Isub4 to less than respective maximum levels Isub1m, Isub2m, Isub3m, Isub4m.

The respective safe levels V1-max, V2-max, V3-max, V4-max for respective drain-source terminal (nodes pairs) of circuit 600 constitute a set of extreme voltage values {Vi} part of a set of constraints {Sj} that include the requirement set {R}. The constraints {S} include, for example, the gain Gc the maximum supply voltage Vddmax, the maximum and minimum input signal voltages, Vin-max, Vin-min, and others. The set of extreme voltages {Vi} are selected based on a corresponding set of maximum safe substrate currents, Isub1$m$, Isub2$m$, Isub3$m$, and Isub4$m$ ({Isub}).

The maximum substrate current levels Isub1$m$, Isub2$m$, Isub3$m$, and Isub4$m$ are established by the particular technology and requirement set {R} chosen for the circuit 600, e.g., for instantaneous gain stability and long-term reliability (i.e. low levels of parameter degradation).

The selection of the respective maximum substrate current levels Isub1$m$, Isub2$m$, Isub3$m$, Isub4$m$ to be allowed for the particular embodiment 600 of the present invention can be achieved by simulation of the circuit 600 using known integrated circuit models and known circuit synthesis and analysis tools. Known models and tools for calculating transistor and circuit behavior with regard to the transistor output resistance (conductance) variation with substrate current are shown by W. Hsu et al. "Design of Reliable VLSI Circuits Using Simulation Techniques", IEEE Journal of Solid-State Circuits, Vol. 26, pp. 452–457, March 1991, incorporated herein by reference.

The computation of the set of voltage extrema {Vi} for the circuit 600 under constraints {R} can be obtained by ordinary practitioners in the arts of circuit design, analysis and synthesis familiar with standard methods. Methods and techniques for circuit analysis and synthesis are shown in standard college texts such as "Principles of Circuit Synthesis", E. S. Kuh, and D. 0. Pederson, McGraw-Hill, New York, N.Y., 1959; and "Analysis of Linear Systems", D. K. Cheng, Addison-Wesley Publishing, Reading, Mass., 1959.

In brief, transistors N1–N4 and amplifier 604 are represented in standard pi or tee equivalent circuit models with a respective set of circuit branches of passive elements {P} and active, dependent signal generating elements {G}. The {P} and {G} elements are interconnected and result in forming a set of polynomial mesh or current loop equations {M} or respective voltage node equations {N} that include Vss, Vdd, V1–V4 and Vin and Vout. The passive elements {P} and active elements {G} are functionally expressed in terms of standard transistor and amplifier model parameters (e.g., pi{We, Le, A,}, tee{We, Le, A}).

The mesh {M} or node {N} equations are solved by standard linear means to give a set of respective expressions {Vi} for the drain-source voltages V1–V4. The {Vi} are expressed in the form w=f(x, y, u, v) where w represents one of voltages V1–V4 having an extreme value Vimax, and the variables x, y, u, v represent the constrained bias variables Vref, Vbias and other circuit requirements (e.g., Vddmax, Vin-min) or circuit operational characteristics (e.g. Gc ) of the circuit 600.

In general, the n constrained variables x, y, u, v are constrained by m additional relations of the form $N_m$(x, y, u, v)=0. $N_m$ represent constraining equations found from the mesh equations {M} or node equations {N} of the circuit 600.

The standard mathematical technique of LaGrange Multipliers may be used to find the values of Vbias and Vref in terms of the extrema for the drain-source voltage set {Vi} under the several conditions of constraint {S}. This is shown, for example, in "Mathematics of Physics and Engineering", I. S. Sokolnikoff, and R. M. Redheffer, McGraw-Hill New York, N.Y., 1958, pg. 254–257.

Dimensions of effective electrical length, Le, and width, We, for the individual transistors N1–N4 of the circuit structure of FIG. 6 are selected to achieve selected required gain Gc and impedance values (i.e., output impedance Rout) defined by the requirement set {R}. Methods for selection are made by means familiar to practitioners of integrated circuit design. The dimensions Le, We, as functions of voltages Vdd-max, Vin-u, Vin-l, and the constrained Vbias, Vref required may be determined by combining the requirements of set {R} with circuit simulation and knowledge of the transistor electrical characteristic variation with substrate current. These are all described in the references cited above and are well known in the art by knowledgeable circuit design practitioners.

By proper selection of the bias voltages Vref and Vbias with respect to specified circuit operating conditions, e.g., Vdd, maximum output voltage Voutmax, Vinu, and Vinl, the maximum required output voltage Vout-max is spread over more than one transistor. This selection reduces the maximum Vds voltage across each transistor N1–N4 from the full value of Vout-max, to no more than the respective desired maximum safe level, i.e., V1-max, V2-max, V3-max, V4-max.

Alternatively the bias levels Vref, Vbias may be selected so that in addition to the limitations of the safe voltage levels, transistor N1 may operate slightly above or into saturation to maximize gain Gc and output voltage swing (e.g., Vout.

In still another alternative for the present invention Vref, Vbias may be selected so that in addition to the limitations of the safe voltage levels, the circuit performance also achieves a maximum output voltage Voutmax at a gain, Gc, slightly reduced from a maximum achievable gain.

The distribution of maximum voltages on transistors N3 and N4 is maintained by biasing their gates to substantially fixed potentials either by connecting directly to power supply potentials, or indirectly by driving from low impedance op-amps referenced to fixed potentials obtained from, e.g., a power supply connected to a multi-tap voltage divider, for example a resistive divider.

The method described above for selecting the bias voltages, Vref, and Vbias to enable performance of the circuit 600 to be stabilized against parameter variation caused by excess drain-source voltage extrema across one or more of the transistors N1–N4 is summarized as a series of steps in the outline below.]

METHOD FOR CHOOSING BIAS VOLTAGE VALUES FOR THE CIRCUIT OF FIG. 6 TO STABILIZE CIRCUIT PERFORMANCE CHARACTERISTICS AGAINST VARIATION CAUSED BY EXCESS SUBSTRATE CURRENT.

STEP 1: SELECT ONE OR MORE CIRCUIT FUNCTIONAL CHARACTERISTIC(S) {Cc}; E.G. CIRCUIT GAIN, Gc, OUTPUT IMPEDANCE, $r_o$ AND MAXIMUM MOMENTARY AND/OR END OF LIFE % VARIATION VALUE(S), {c} AS A FIRST PART OF A REQUIREMENT SET {R}.

STEP 2: SELECT ONE OR MORE EXTERNAL CIRCUIT VOLTAGE LIMITS; I.E, EXTERNAL CIRCUIT CONSTRAINTS SET {Vx}, e.g.: VINmin/max, VDDmin/max, VOUTmin/max, VOUTmax.] AS A SECOND PART OF THE REQUIREMENT SET {R}.

STEP 3: PERFORM INITIAL OPERATING POINT BIAS ANALYSIS TO CHOOSE INITIAL FIXED BIAS GATE VOLTAGE VALUES {Vi}. FOR THE GATES N3, - - - N(i), - - - N(n). SELECT THE INITIAL FIXED GATE VOLTAGE VALUES {Vi} TO OPERATE THE SELECTED TRANSISTORS {Nn} IN RESPECTIVE INITIAL SATURATION AND TRIODE OPERATING POINTS ({OP1 FOR TRANSISTOR N1, OP2n FOR TRANSISTORS N2, N3, CNn).
  NOTE: FOR ONE ADDITIONAL TRANSISTOR, N3, i=1 AND {Vi}=(Vref),. FOR TWO ADDITIONAL TRANSISTORS, N3, N4, i=2 AND {Vi}=e.g. Vref, Vbias..

STEP 4: PERFORM ELECTRICAL CIRCUIT ANALYSIS AND SYNTHESIS WITH THE SELECTED 600 CIRCUIT TRANSISTORS {Nn}, BIASES {Vi} UNDER THE GIVEN CONSTRAINTS.
  NOTE: IF REQUIRED, PERFORM ELECTRICAL CIRCUIT ANALYSIS AND SYNTHESIS TO SELECT TRANSISTOR WIDTHS AND LENGTHS {Wn, Ln} FOR THE SELECTED {Nn} TRANSISTORS N1, N2, N3, - - - Nn, TO MEET THE REQUIREMENT SET {Cc}, (e.g. Gc AND $r_o$)

STEP 5: PERFORM CIRCUIT ANALYSIS AND SIMULATION ON THE CIRCUIT 600 FROM STEP 3 WITH KNOWN SIMULATION TOOLS AND METHODS TO COMPUTE INITIAL, MOMENTARY AND END-OF-LIFE PERFORMANCE.
  5A: COMPUTE WORST CASE MOMENTARY PEAK AND CUMULATIVE (END OF LIFE) EXPECTED SUBSTRATE CURRENTS {Isubn} FOR THE TRANSISTORS {Nn}.
  5B: CONFIRM THAT THE SERIES SUM OF TRANSISTOR VOLTAGE EXTREMA FOR THE TRANSISTORS {Nn} EQUALS THE MAXIMUM OUTPUT VOLTAGE: Vn max=VOUTmax.,
  5C: COMPUTE WORST CASE MOMENTARY PEAK VOLTAGE EXTREMA {Vn max} FOR THE TRANSISTORS {Nn}
  5C: COMPUTE INITIAL, WORST CASE MOMENTARY PEAK AND CUMULATIVE ELECTRICAL PARAMETER VARIATION AND WORST CASE MOMENTARY PEAK AND CUMLATIVE VARIATION(S) OF THE CIRCUIT PERFORMANCE CHARACTERISTIC(S) {C}$_C$.

STEP 7: TEST 1: IS (ARE) THE COMPUTED CIRCUIT PERFORMANCE CHARACTERISTIC VARIATION (S), {c}$_c$, DUE TO SUBSTRATE CURRENT GENERATION WITHIN CONSTRAINED LIMITS {c} ? IF YES, GO TO END, IF NO, GO TO NEXT STEP.

STEP 8: TEST 2: IS THE EXCESSIVE VARIATION OF THE COMPUTED WORST CASE MOMENTARY

PEAK AND CUMLATIVE CIRCUIT PERFORMANCE CHARACTERISTIC VARIATION(S), DUE TO EXCESS SUBSTRATE CURRENT GENERATION (Isub(i)) IN TRANSISTOR (i) CAUSED BY AN EXCESSIVELY LARGE VALUE OF DRAIN-SOURCE VOLTAGE EXTREME Vds(i)max, RELATIVE TO THE VALUES OF DRAIN-SOURCE VOLTAGE EXTREMES {Vds(n−1)max } OF THE OTHER n−1 DRAIN-SOURCE SERIES CONNECTED TRANSISTORS? IN OTHER WORDS, IS THERE AN IMBALANCE IN THE DISTRIBUTION OF DRAIN-SOURCE VOLTAGES Vds(i)max BETWEEN TRANSISTOR N1 AND TRANSISTORS N2, N3, - - - -Ni - - - Nn SO THAT THE TOTAL Voutmax CAN BE REDISTRIBUTED ACROSS THE TRANSISTORS {Nn}?.

IF TEST 2 IS YES SKIP NEXT STEP, IF NO, DO NEXT STEP.

STEP 9: CHANGE THE CIRCUIT CONFIGURATION OF CIRCUIT 600 TO INCLUDE AN ADDITIONAL DRAIN-SOURCE CONNECTED TRANSISTOR N(i+1) IN SERIES WITH N3, (and/or N4), BETWEEN Vout AND THE DRAIN OF N2, AND ADD AN ADDITIONAL FIXED BIAS VOLTAGE Vb(i+1) CONNECTED TO THE GATE OF THE ADDITIONAL TRANSISTOR N(i+1).

TEST 3: IF THE NUMBER OF ITERATIONS (i) IS TOO LARGE, (E.G. THE NUMBER OF ADDITIONAL TRANSISTORS IS GREATER THAN PERMISSIBLE, THERE IS NO SOLUTION WITH THE SET OF THE CIRCUIT PERFORMANCE CONSTRAINTS SELECTED) THEN GO TO END, OTHERWISE, GO TO STEP 10.

STEP 10. RE-APPORTION DRAIN-SOURCE VOLTAGE EXTREMA {V'(n)max} TO DECREASE THE RESPECTIVE EXCESS VOLTAGE EXTREMA V(i) max ACROSS TRANSISTOR (i) TO V'(i)max (AND TO DECREASE ITS CORRESPONDING EXCESS PEAK SUBSTRATE CURRENT {Isub(i)max}), AND TO DISTRIBUTE THE BALANCE Voutmax−V'(i) max ACROSS THE REMAINING SERIES CONNECTED TRANSISTORS. N(n−1).

STEP 11. COMPUTE A NEW SET OF FIXED BIAS VOLTAGES {Vbi}, E.G.(Vref, Vbias, - - - ), (E.G., BY THE METHOD OF LAGRANGE MULTIPLIERS) UNDER THE CONSTRAINTS OF THE REQUIREMENT SET {R} AND THE REAPPORTIONED DRAIN-SOURCE VOLTAGE EXTREMA {V'(n) max} FOUND IN STEP 10. GO TO STEP 3.

END.

An Alternative Circuit Embodiment of the Present Invention

Figure 7:
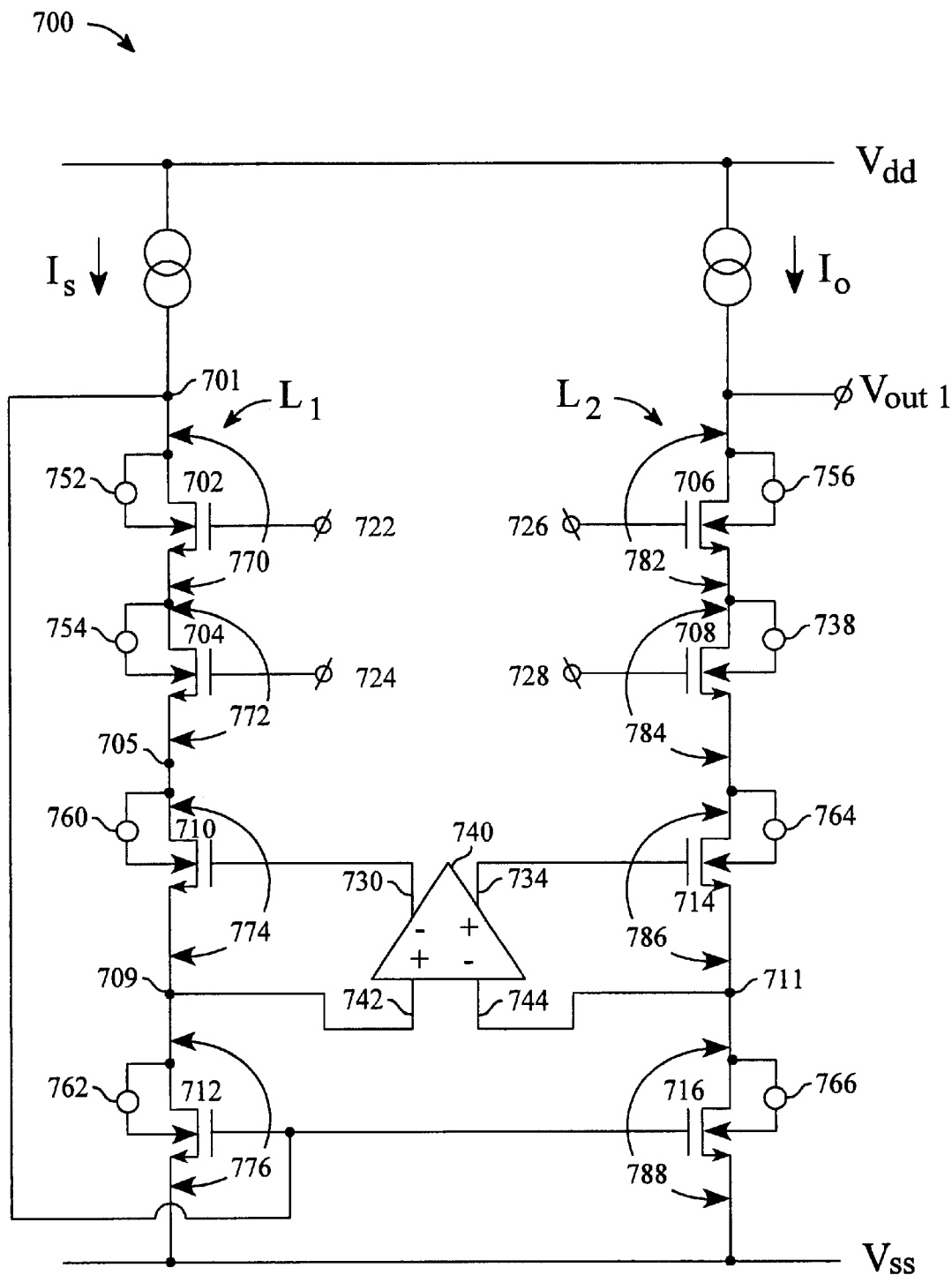
FIG. 7 displays an alternative embodiment of the drain-source voltage-limiting bias circuit arrangement for a cascode current mirror circuit according to the present invention.

With reference to FIG. 7 there is shown an alternative embodiment of the invention in a current mirror circuit 700. Circuit 700 is a cascode current mirror that can be used as a high impedance output stage of a high gain amplifier stage e.g. the circuit in FIG. 6.

A signal source current, Is, (e.g., the output Vout of FIG. 6) drives an input terminal 701, of the current mirror. Another current source Io, drives an output terminal Vout1, of the current mirror. Both Is and Io are sourced from power-supply terminal Vdd.

As in other embodiments of the present invention, in the current mirror circuit 700, additional voltage sharing source-drain connected series transistors 702, 704 are arranged in an input series current path L1. The series current path L1 extends from the input terminal 701 through the series connected transistors 702, 704 to a drain terminal 705 of upper cascode transistor 710 and continues through series connected lower cascode transistor 712 to Vss (ground). Upper transistor 710 and lower transistor 712 are joined at respective source and drain terminals at a common junction 709.

Also additional voltage sharing source-drain connected series transistors 706, 708 are arranged in an output series current path L2. The series current path L2 extends from the output terminal Vout1 through the series connected transistors 706,708 to a drain terminal 707 of upper cascode transistor 714 and continues through series connected lower cascode transistor 716 to Vss (ground). Upper transistor 714 and lower transistor 716 are joined at respective source and drain terminals at a common junction 711.

Corresponding gates of transistors 702, 704 and 706, 708 are biased by fixed voltage sources 722, 724, 726, 728 respectively. Transistors 710, 714 gates are driven from complement (−) and true(+) outputs 730, 734 of a dual op-amp 740. Corresponding inverting, non-inverting inputs 742, 744 of the op-amp 740 are connected to common junctions 709, 711 respectively.

The current mirror circuit 700 provides high output impedance and current gain by the ratio of the size of transistors 716 and 712 as is well known.

Let Qc[J] refer to the group of the four drain-to-source connected cascode transistors, (two chains of series connected transistors) [710, 712] and [714, 716]. Let Qa[K] refer to the group of additional drain-to-source series connected transistors (two additional chains of series connected transistors) [702, 704] and [706, 708]. For $1<j<2$, transistors Qc[j] are the cascode (chain) transistors Qc[J1] in the first series path L1 connecting from an upper drain terminal 705 of the chain Qc[J1] to Vss. For $3<j<4$, transistors Qco are the cascode (chain) transistors Qc[J2] in the second series path L2 connecting from an upper drain terminal 707 of the chain Qc[J2] to Vss. Furthermore, let the respective bias voltages 722, 724, 726, and 728 be represented by Vb[K] corresponding to the Qa[K] additional series transistors 702, 704, 706, and 708.

For $1<k<2$ transistors Qa[k] are the additional drain-to-source series connected (i.e. chain) transistors Qa[K1] in the series path L1 connecting from the input node 701 to the upper drain terminal 705 of the first cascode chain Qc[J1]. Similarly, For $3<k<4$ transistors Qa[k] are the additional drain-to-source series (chain) connected transistors Qa[K2] in the series path L2 connecting from the output node Vout1 to the upper drain terminal 707 of the cascode chain Qc[J2].

A limit value for excess substrate current for each transistor Qc[j] in the chains Qc[J1] and Qc[J2] caused by a respective drain-to-source voltage stress Vds[j] can be represented as the respective maximum allowable substrate current Isubmax(j) for the transistor, Q[j], caused by the corresponding drain-source voltage Vds(j)=Vdsmax(j).

In order to stabilize the gain of the circuit 700 from degradation by excessive substrate current (i.e., at Vds(j) >Vdsmax(j)) due to voltage overstress on the cascode transistors 712, 710 and 714, 714, the biased-stabilizing additional transistors Q[k] e.g. transistors 702, 704 and 706, 708, are selectively biased by respective voltage bias sources Vb(k) e.g. 722, 724 and 726, 728, to limit the respective cascode transistor voltages Vds(j) (i.e. 774, 776, 786, 788) to not exceed a respective maximum Vdsmax(j).

The maximum voltage (Vds(j)=Vdsmax(j)) that will appear across each respective series cascode transistor Qc[j] depends on the operational conditions under which the circuit 700 is operated. For a given set {R} of selected performance characteristics (e.g. gain and output impedance) and selected operational characteristics [e.g. high and low limits of the input signal (Ismax, Ismin), selected maximum supply voltage limit VDDmax and selected maximum output voltage level, Voutmax and maximum output voltage swing (dynamic range, Voutmax−Voutmin)] the bias voltages Vb(k) are selected to limit the drain-to-source voltages Vds(j) of the cascode transistors Qc(j) to be less than the respective maximums Vds(j)max, thereby stabilizing the selected circuit performance characteristic(s) for the selected operational characteristic (s).

In general, in a current path through a chain of series connected transistors (e.g. L1 or L2) connected between a source of current, (e.g. node 701 and/or Vout1) and ground (e.g. Vss), to ensure that substrate currents Isub(j), for drain-to-source connected cascode transistors (Qc[j]) in a cascode portion (e.g. Qc[J]) of the chain (L1, L2) connected between an intermediate drain node (e.g. nodes 705 or 707) to ground do not exceed selected limits (e.g. Isub(j)max), the respective gates of corresponding additional transistors (e.g. Qa[k]) in an interposed portion (e.g. Qa[K]) of the chain (L1 or L2) coupled between the intermediate drain node (e.g. nodes 705 or 707) and a respective source of current (e.g. Io or Is) are connected to respective bias voltages (e.g. Vb[k]) and the bias voltages are selected to limit the respective maximum drain-to-source voltage excursions (e.g. Vds(j) max) on the transistors Qc[J] to not exceed a corresponding maximum (e.g. Vdsmax(j)).

In addition, the series connected, voltage-sharing, biased-stabilized transistors 702, 704 and 706, 708 may be biased by the respective bias sources 722, 724 and 726, 728 to operate from their respective triode regions into their respective saturation regions as the output voltage Vout1 swings from maximum output voltage, Vout1 max to the minimum output voltage, Vout1min.

Thus the circuit 700 is stabilized to retain high output impedance, and a high gain characteristic over a wide output voltage dynamic range while simultaneously eliminating or minimizing gain or output impedance degradation due to excessive substrate current generation from voltage overstress.

The actual bias voltage values for the respective bias sources 722, 724 and 726, 728 are dependent on the particular values for Vddmax, Voutmin, Voutmax, Ismin and Ismax and the particular respective transistor width (We(i)), length (Le(i)) and width-to-length ratio (We(i)/Le(i)) considered, where (i) represents the transistors Qc(j) and Qa(k). Solution for the bias voltage values Vb(k) for the respective bias sources 722, 724 and 726, 728 then becomes a circuit simulation and transistor modelling analysis problem, e.g. as that shown in the references described above.

Solution methods are known for solving such conditionally constrained problems. For example, the circuit 700 may be represented as a linear circuit graph or schematic (not shown) using known linear circuit models for the transistors Qc(j) and Qa(k). A set of loop or node equations (not shown) can be written and solved by matrix methods to determine respective node voltages and loop currents for the circuit 700 linear circuit schematic. A corresponding set of related polynomial equations can be derived from the set of loop and node equations incorporating the selected operational and performance limits. Application of known mathematical techniques, such as the method of LaGrange polynomials can be used to determine the desired set of Vb(k) bias voltages for achieving the selected operational and performance characteristics for the circuit 700.

Suitable selection of the bias values Vb(k) for the respective bias sources 722, 724 and 726, 728 to limit substrate currents to less than the excess limits thus ensures that the selected characteristic (gain, output resistance) of the current mirror circuit 700 is stabilized over the expected operating supply voltage and input signal levels.

It will be apparent to skilled practitioners of electrical circuit design and modelling, by application of the techniques shown in the present circuit characteristic stabilizing invention, that more than just the two cascode transistors 710 and 712 or 714 and 716 may be protected from excessive drain-to-source voltages. By suitable addition of more than two series drain-source connected transistors Qa(k) in a current path L1 or L2 and by suitable selection of bias voltages Vb(k), other transistors, specifically transistors selected from the group of the additional drain-source connected transistor Qa(k) may also be protected from excessive drain-to-source voltage Vds(k).

Although the reduced hot electron effect, performance stabilizing cascode circuit invention has been described for a single-well n-channel CMOS process, it is apparent that embodiments of the substrate current-bias stabilizing circuit invention may be implemented using transistors fabricated by a single-well p-channel or a dual-well CMOS process by appropriate changes in voltage polarity and current flow.

What is claimed is:

1. A cascode circuit comprising:

a first transistor having respective source, drain and gate terminal, said first transistor gate terminal coupled to an input signal referenced to a first power supply and said first transistor source terminal coupled to said first power supply;

a second transistor having respective source, drain and gate terminal;

said second transistor source terminal and said first transistor drain terminal coupled to form a first source-drain connection;

a first cascode circuit output terminal coupled to a second power supply voltage;

first circuit means for biasing said second transistor gate terminal with respect to said first power supply such that said first transistor operates in a saturation operating region; and a voltage limiting circuit interposed between said first output terminal and said second transistor drain adapted to limit a respective first drain-to-source voltage across said first transistor and a respective second drain-to-source voltage across said second transistor not to exceed a corresponding first maximum drain-to-source voltage limit and a corresponding second maximum drain-to-source voltage limit, the voltage limiting circuit comprising a third transistor having respective source, drain and gate terminals, said third transistor drain being coupled to said output terminal, said third transistor source being coupled to said second transistor drain and said third transistor gate being coupled to a selected, substantially fixed voltage.

2. The cascode circuit according to claim 1, wherein said selected, substantially fixed voltage is selected to limit said first transistor drain-to-source voltage and said second transistor drain-to-source voltage to not exceed said respective maximum drain-to-source voltage limits.

3. The cascode circuit according to claim 1, in which said selected, substantially fixed voltage is said second power supply terminal.

4. A cascode circuit comprising:
a first transistor having respective source, drain and gate terminals, said first transistor gate terminal coupled to an input signal referenced to a first power supply and said first transistor source terminal coupled to said first power supply;
a second transistor having respective source, drain and gate terminals;
said second transistor source terminal and said first transistor drain terminal coupled to form a first source-drain connection;
a cascode circuit output terminal coupled to a second power supply voltage;
first circuit means for biasing said second transistor gate terminal with respect to said first power supply such that said first transistor operates in a saturation operating region; and
a voltage limiting circuit interposed between said first output terminal and said second transistor drain adapted to limit a respective first drain-to-source voltage across said first transistor and a respective second drain-to-source voltage across said second transistor not to exceed a corresponding first maximum drain-to-source voltage limit and a corresponding second maximum drain-to-source voltage limit, the voltage limiting circuit comprising:
a first additional transistor having respective drain, gate and source terminals;
a second additional transistor having respective drain, gate and source terminals;
said second additional transistor drain terminal being coupled to said output terminal;
said second additional transistor source terminal being coupled to said first additional transistor drain terminal;
said first additional transistor source terminal being coupled to said first transistor drain terminal;
said first additional transistor gate being adapted to couple to a selected first substantially fixed voltage; and
said second additional transistor gate being adapted to couple to a selected second substantially fixed voltage.

5. The cascode circuit according to claim 4, wherein said first substantially fixed voltage and said second substantially fixed voltage are selected so that said first transistor drain-to-source voltage and said second transistor drain-to-source voltage do not exceed said respective maximum drain-to-source voltage values.

6. The cascode circuit according to claim 5, wherein one of said selected first and second substantially fixed voltages is adapted to be coupled to said second power supply terminal.

7. A cascode circuit comprising:
a first transistor having respective source, drain and gate terminals, said first transistor gate terminal coupled to an input signal referenced to a first power supply and said first transistor source terminal coupled to said first power supply;
a second transistor having respective source, drain and gate terminals;
said second transistor source terminal and said first transistor drain terminal coupled to form a first source-drain connection;
a cascode circuit output terminal coupled to a second power supply voltage;
first circuit means for biasing said second transistor gate terminal with respect to said first power supply such that said first transistor operates in a saturation operating region; and
a voltage limiting circuit interposed between said first output terminal and said second transistor drain adapted to limit a respective first drain-to-source voltage across said first transistor and a respective second drain-to-source voltage across said second transistor not to exceed a corresponding first maximum drain-to-source voltage limit and a corresponding second maximum drain-to-source voltage limit, the voltage limiting circuit comprising:
a plurality of additional individual transistors each having respective individual drain, gate and source terminals, said plurality of additional individual transistors interposed in serial source-drain connection between said output terminal and second transistor drain terminal; and
each respective gate of said plurality of additional individual transistors being adapted to be coupled to a corresponding substantially fixed voltage source, each one of said corresponding fixed voltages being selected to co-operate with said voltage limiting circuit,
whereby said first transistor drain-to-source voltage and said second transistor drain-to-source voltage do not exceed said respective first and said second maximum drain-to-source voltage limits.

8. A cascode circuit comprising:
a first transistor having respective source, drain and gate terminals, said first transistor gate terminal coupled to an input signal referenced to a first power supply and said first transistor source terminal coupled to said first power supply;
a second transistor having respective source, drain and gate terminals;
said second transistor source terminal and said first transistor drain terminal coupled to form a first source-drain connection;
a cascode circuit output terminal coupled to a second power supply voltage;
first circuit means for biasing said second transistor gate terminal with respect to said first power supply such that said first transistor operates in a saturation operating region; and
a voltage limiting circuit interposed between said first output terminal and said second transistor drain adapted to limit a respective first drain-to-source voltage across said first transistor and a respective second drain-to-source voltage across said second transistor not to exceed a corresponding first maximum drain-to-source voltage limit and a corresponding second maximum drain-to-source voltage limit, the voltage limiting circuit comprising at least one additional transistor having respective source, drain and gate terminals, said drain of said at least one additional transistor being coupled to said output terminal, said source of said at least one additional transistor being coupled to said drain of said second transistor and said gate of said at least one additional transistor being coupled to a selected substantially fixed voltage, said selected substantially fixed voltage cooperating with said circuit,
wherein said first transistor, said second transistor, said coupling to said second power supply, said first circuit means for biasing, said first drain-to-source voltage and said second drain-to-source voltage are selected such that said cascode circuit defines a circuit performance characteristic that provides maximum drain-to-source voltage values.

9. The cascode circuit according to claim 8, wherein said selected substantially fixed voltage is said second power supply terminal.

10. The cascode circuit according to claim 8, wherein said voltage limiting circuit comprises:

drain-source series connected first and second additional transistors having respective drain, gate and source terminals, said drain-source series being connected to first and second additional transistors interposed between said output terminal and said second transistor drain terminal;

a selected first substantially fixed voltage coupled to said first additional transistor gate;

a selected second substantially fixed voltage coupled to said second additional transistor gate; and said selected first substantially fixed voltage and said selected second substantially fixed voltage being selected such that said cascode circuit exhibits said performance characteristic limit.

11. The cascode circuit according to claim 10, wherein said second power supply terminal is at least one of said selected first and second substantially fixed voltages.

12. The cascode circuit according to claim 10, comprising;

a selected length, Le, and width, We, for a respective one of said transistors, said selected length, Le and width, We, selected to co-operate with said voltage limiting circuit to establish a respective limit value for a corresponding circuit operational characteristic, where said respective limit value and said corresponding circuit operational characteristic comprises at least one of the following:

a maximum limit value for said second power-supply voltage;

an upper input voltage limit for said input signal;

a lower input voltage limit for said input signal;

an upper output voltage limit for said output terminal;

a lower output voltage limit for said output terminal;

a bias voltage limit for said Vbias voltage; and a reference voltage limit for said reference voltage.

13. The cascode circuit according to claim 10, wherein said cascode circuit is operated within voltage operating limits selected from the group of maximum cascode output voltage, minimum cascode circuit output voltage, maximum input terminal voltage and maximum input terminal voltage.

14. A cascode circuit comprising:

a first transistor having respective source, drain and gate terminals, said first transistor gate terminal coupled to an input signal referenced to a first power supply and said first transistor source terminal coupled to said first power supply;

a second transistor having respective source, drain and gate terminals;

said second transistor source terminal and said first transistor drain terminal coupled to form a first source-drain connection;

a cascode circuit output terminal coupled to a second power supply voltage;

first circuit means for biasing said second transistor gate terminal with respect to said first power supply such that said first transistor operates in a saturation operating region, said first circuit means comprising a differential amplifier that comprises:

an inverting input coupled to said first source-drain connection;

a non-inverting input coupled to a substantially fixed reference voltage; and an amplifier output terminal responsive to a voltage difference between said inverting input and said non-inverting input, in which said amplifier output terminal is coupled to said gate of said second transistor; and a voltage limiting circuit interposed between said first output terminal and said second transistor drain adapted to limit a respective first drain-to-source voltage across said first transistor and a respective second drain-to-source voltage across said second transistor not to exceed a corresponding first maximum drain-to-source voltage limit and a corresponding second maximum drain-to-source voltage limit.

\* \* \* \* \*